(12) United States Patent
Kim et al.

(10) Patent No.: US 7,772,907 B2
(45) Date of Patent: Aug. 10, 2010

(54) LINEAR DIGITAL PHASE INTERPOLATOR AND SEMI-DIGITAL DELAY LOCKED LOOP (DLL)

(75) Inventors: Jin-gook Kim, Suwon-si (KR); Seung-jun Bae, Daejeon (KR); Kwang-il Park, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/255,170

(22) Filed: Oct. 21, 2008

(65) Prior Publication Data

US 2009/0102523 A1    Apr. 23, 2009

(30) Foreign Application Priority Data

Oct. 22, 2007    (KR) .................. 10-2007-0106210

(51) Int. Cl.
*H03H 3/00*    (2006.01)
*H03K 5/13*    (2006.01)

(52) U.S. Cl. .................. 327/231; 327/256; 327/276; 327/277

(58) Field of Classification Search .......... 327/231–290
See application file for complete search history.

(56) References Cited

U.S. PATENT DOCUMENTS 6,727,741 B2    4/2004    Huang et al.

2006/0256205 A1*    11/2006    Kim et al. ................ 348/222.1
2007/0018707 A1*    1/2007    Rajagopal et al. ........... 327/231

FOREIGN PATENT DOCUMENTS

KR    1020030003903 A    1/2003
KR    1020060117396 A    11/2006

* cited by examiner

*Primary Examiner*—Lincoln Donovan
*Assistant Examiner*—Brandon S Cole
(74) *Attorney, Agent, or Firm*—Volentine & Whitt, PLLC (57) ABSTRACT

Provided are a digital phase interpolator, which performs linear phase interpolation irrelevantly to input order of two input signals, and a semi-digital delay locked loop (DLL), which includes and controls the same. The phase interpolator includes: a first clocked inverter controlled by a phase indicating signal and providing a first output signal to a common output terminal by inverting a first input signal, and a second clocked inverter controlled by the phase indicating signal and providing a second output signal to the common output terminal by inverting the second input signal. The second clocked inverter is clocked by the first input signal when the phase indicating signal is in a first logic state, and the first clocked inverter is clocked by the second input signal when the phase indicating signal is in a second logic state. The phase indicating signal indicates a lead/lag phase relationship between the first and second input signals and is generated in a controller of a circuit of the semi-digital DLL.

19 Claims, 5 Drawing Sheets

LINEAR DIGITAL PHASE INTERPOLATOR AND SEMI-DIGITAL DELAY LOCKED LOOP (DLL)

CROSS-REFERENCE TO RELATED PATENT APPLICATION

This application claims the benefit of Korean Patent Application No. 10-2007-0106210 filed on Oct. 22, 2007, the subject matter of which is hereby incorporated by reference.

BACKGROUND

The present invention relates generally to semiconductor devices, and more particularly, to a digital phase interpolator and a semi-digital delay locked loop (DLL) incorporating same.

Numerous semiconductor devices use specialized circuits to adjust timing delays for input/output (I/O) signals, clock signals, etc. The digital phase interpolator is one such circuit and is commonly used to adjust the timing of internal clock signal(s) within semiconductor devices.

The digital phase interpolator receives two input signals having different phases and generates an output signal having a defined phase between the two received input signals. The digital phase interpolator may be implemented in a simple circuit, and can precisely output a defined phase. As a result, the digital phase interpolator is used in various semiconductor devices applications and circuits, such as a semi-digital DLL. One conventional example of a digital phase interpolator is disclosed in U.S. Pat. No. 6,727,741.

However, conventional digital phase interpolators always receive one input signal before the other. Thus, one input signal has a leading phase relative to the other input signal phase. This operational result is fine for some applications, but presents a problem for other applications and circuit. For example, when the relative (lead/lag) phases for two input signals received by a digital phase interpolator, such as one incorporated within a semi-digital DLL, continuously change, it is difficult to track which one of the two input signals is first received, and the conventional digital phase interpolator becomes difficult to use.

SUMMARY OF THE INVENTION

Embodiments of the invention provide a digital phase interpolator which performs linear phase interpolation in a manner agnostic to the order of received input signals, and a semi-digital DLL including and efficiently controlling this type of digital phase interpolator.

According to one embodiment, the invention provides a phase interpolator comprising; a first clocked inverter, controlled by a phase indicating signal and providing a first output signal to a common output terminal by inverting a first input signal, and a second clocked inverter, controlled by the phase indicating signal and providing a second output signal to the common output terminal by inverting a second input signal, wherein the second clocked inverter is clocked by the first input signal when the phase indicating signal is in a first logic state, and the first clocked inverter is clocked by the second input signal when the phase indicating signal is in a second logic state.

According to another embodiment, the invention provides a circuit of a semi-digital delay locked loop (DLL), the circuit comprising; a digital multi-phase DLL circuit generating first group reference clock signals and second group reference clock signals having different phases in relation to an input clock signal, a phase detector detecting a phase difference between a phase reference clock signal and an output clock signal, a controller generating first and second selecting signals, and a phase indicating signal in response to an output signal of the phase detector, a first selector outputting one of the first group reference clock signals in response to the first selecting signal, a second selector outputting one of the second group reference signals in response to the second selecting signal, and a digital phase interpolator generating the output clock signal by linearly interpolating phases of the first and second input signals regardless of the relative lead/lag phase states of the first and second input signals, wherein the phase of the first input signal is provided from the first selector and the phase of the second input signal provided from the second selector in response to the phase indicating signal.

DESCRIPTION OF EMBODIMENTS

Hereinafter, embodiments of the present invention will be described with reference to the accompanying drawings. It should be noted, however, the invention may be variously embodied and is not limited to only the illustrated embodiments. Throughout the drawings and written description, like reference numerals and indicators are used to denote like or similar elements.

Figure 1:
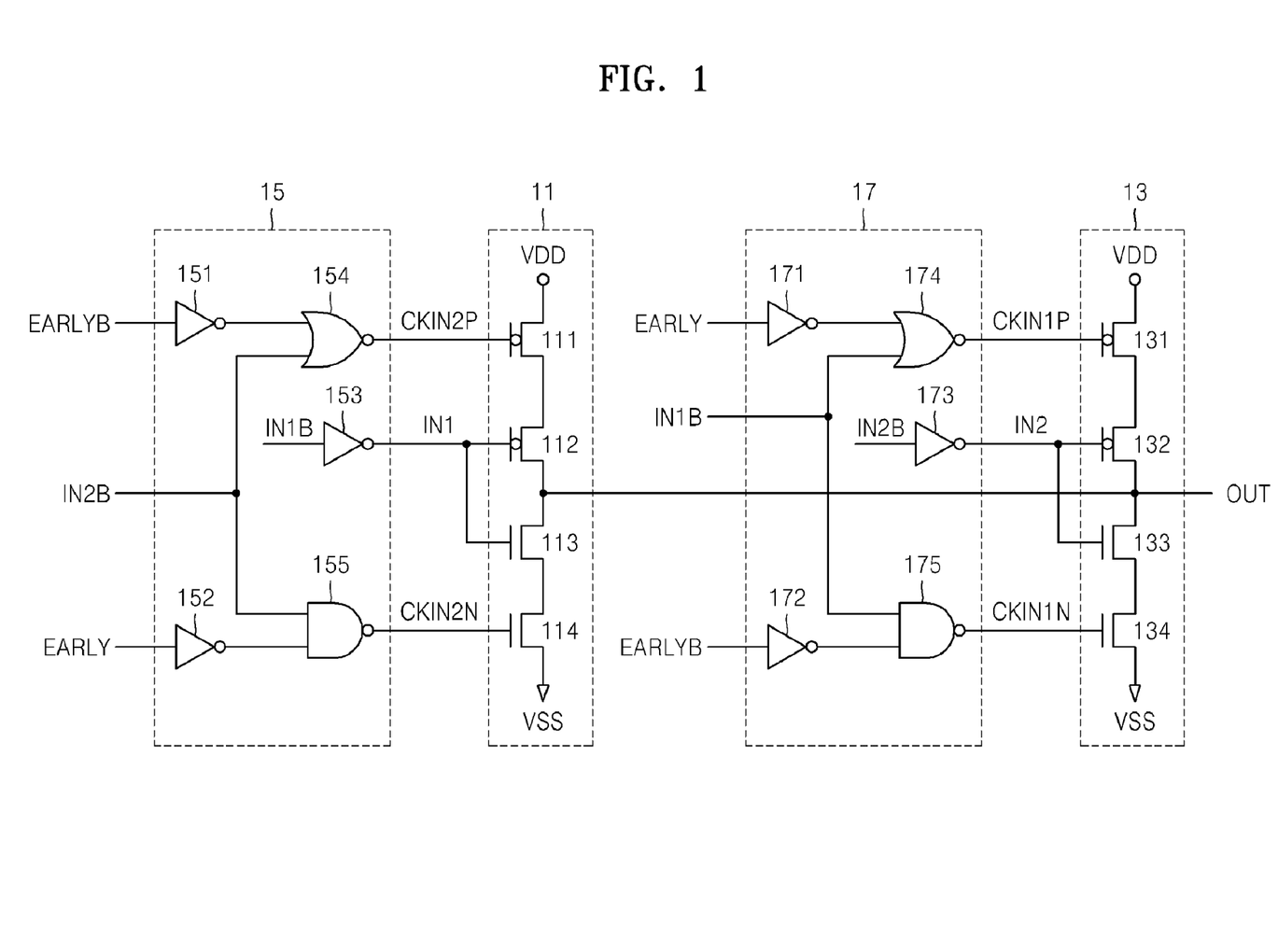
FIG. 1 is a circuit diagram illustrating a digital phase interpolator according to an embodiment of the invention.

FIG. 1 is a circuit diagram illustrating a digital phase interpolator according to an embodiment of the present invention.

Referring to FIG. 1, the digital phase interpolator includes a first clocked inverter 11, a second clocked inverter 13, a first control circuit 15, and a second control circuit 17.

The first clocked inverter 11 and the second clocked inverter 13 are connected to a common output terminal OUT. The first clocked inverter 11 is controlled by a phase indicating signal EARLY and an inverted signal EARLYB thereof (actually controlled by clock signals CKIN2P and CKIN2N generated by the first control circuit in response to the phase indicating signal EARLY and the inverted signal EARLYB), and outputs a first output signal to the common output terminal OUT by inverting the first input signal IN1.

The second clocked inverter 13 is controlled by the phase indicating signal EARLY and the inverted signal EARLYB thereof (actually controlled by clock signals CKIN1P and CKIN1N generated by the second control circuit 17 in response to the phase indicating signal EARLY and the inverted signal EARLYB), and outputs a second output signal to the common output terminal OUT by inverting the second input signal IN2.

The second control circuit 17 provides an inverted signal IN1B of the first input signal IN1 as the clock signals CKIN1P and CKIN1N of the second clocked inverter 13 after inverting the inverted signal IN1B when the phase indicating signal EARLY is in a first logic state, (e.g. a logically high state). In other words, the second control circuit 17 provides the first input signal IN1 as the clock signals CKIN1P and CKIN1N of the second clocked inverter 13 when the phase indicating signal EARLY is in the first logic state.

The first control circuit 15 provides an inverted signal IN2B of the second input signal IN2 as the clock signals CKIN2P and CKIN2N of the first clocked inverter 11 after inverting the inverted signal IN2B when the phase indicating signal EARLY is in a second logic state, (e.g., a logically low state). In other words, the first control circuit 15 provides the second input signal IN2 as the clock signals CKIN2P and CKIN2N of the first clocked inverter 11 when the phase indicating signal EARLY is in the second logic state.

Accordingly, when the phase indicating signal EARLY is in the first logic state, the second clocked inverter 13 is clocked by the first input signal IN1, and when the phase indicating signal EARLY is in the second logic state, the first clocked inverter 11 is clocked by the second input signal IN2.

The phase indicating signal EARLY shows input order of the first and second input signals IN1 and IN2. In other words, the phase indicating signal EARLY shows the phase of which signal from among the first and second input signals IN1 and IN2 precedes. When the phase of the first input signal IN1 precedes the phase of the second input signal IN2, the phase indicating signal EARLY is in the first logic state, and when the phase of the second input signal IN2 precedes the phase of the first input signal IN1, the phase indicating signal EARLY is in the second logic state.

Elements of the first clocked inverter 11, the second clocked inverter 13, the first control circuit 15, and the second control circuit 17 will now be described.

The first control circuit 15 includes an inverter 151, an inverter 152, an inverter 153, a NOR gate 154, and a NAND gate 155. The inverter 151 inverts and then outputs the inverted signal EARLYB of the phase indicating signal EARLY, and the inverter 152 inverts and then outputs the phase indicating signal EARLY. The inverter 153 receives and then inverts the inverted signal IN1B of the first input signal IN1, and provides an output signal to the first clocked inverter 11 as the first input signal IN1.

The NOR gate 154 receives an output signal of the inverter 151 and the inverted signal IN2B of the second input signal IN2, and provides an output signal as a pull-up clock signal CKIN2P of the first clocked inverter 11. The NAND gate 155 receives an output signal of the inverter 152 and the inverted signal IN2B of the second input signal IN2, and provides an output signal as a pull-down clock signal CKIN2N of the first clocked inverter 11.

The second control circuit 17 includes an inverter 171, an inverter 172, an inverter 173, a NOR gate 174, and a NAND gate 175. The inverter 171 inverts and then outputs the phase indicating signal EARLY, and the inverter 172 inverts and then outputs the inverted signal EARLYB of the phase indicating signal EARLY. The inverter 173 receives and then inverts the inverted signal IN2B of the second input signal IN2, and provides an output signal to the second clocked inverter 13 as the second input signal IN2.

The NOR gate 174 receives an output signal of the inverter 171 and the inverted signal IN1B of the first input signal IN1, and provides an output signal as a pull-up clock signal CKIN1P of the second clocked inverter 13. The NAND gate 175 receives an output signal of the inverter 172 and the inverted signal IN1B of the first input signal IN1, and provides an output signal as a pull-down clock signal CKIN1N of the second clocked inverter 13.

The first clocked inverter 11 includes a PMOS transistor 111, a PMOS transistor 112, an NMOS transistor 113, and an NMOS transistor 114. In the PMOS transistor 111, a supply voltage VDD is applied to the source, and the pull-up clock signal CKIN2P is applied to the gate. In the PMOS transistor 112, the drain of the PMOS transistor 111 is connected to the source, the first input signal IN1 is applied to the gate, and the common output terminal OUT is connected to the drain.

In the NMOS transistor 113, the common output terminal OUT is connected to the drain, and the first input signal IN1 is applied to the gate. In the NMOS transistor 114, source of the NMOS transistor 113 is connected to the drain, the pull-down clock signal CKIN2N is applied to the gate, and a ground voltage VSS is applied to the source.

The second clocked inverter 13 includes a PMOS transistor 131, a PMOS transistor 132, an NMOS transistor 133, an NMOS transistor 134. In the PMOS transistor 131, the supply voltage VDD is applied to the source, and the pull-up clock signal CKIN1P is applied to the gate. In the PMOS transistor 132, the drain of the PMOS transistor 131 is connected to the source, the second input signal IN2 is applied to the gate, and the common output terminal OUT is connected to the drain.

In the NMOS transistor 133, the common output terminal OUT is connected to the drain, and the second input signal IN2 is applied to the gate. In the NMOS transistor 134, the source of the NMOS transistor 133 is connected to the drain, the pull-down clock signal CKIN1N is applied to the gate, and the ground voltage VSS is applied to the source.

Operation of the digital phase interpolator will now be described in more detail with reference to FIG. 1. When the phase of the first input signal IN1 leads the phase of the second input signal IN2, the phase indicating signal EARLY assumes the first logic state. Accordingly, the pull-up clock signal CKIN2P of the first clocked inverter 11 goes "low" (i.e., assumes a logically low state given the assumptions regarding first and second logic states above), and the pull-down clock signal CKIN2N of the first clocked inverter 11 goes high regardless of the relative phase of the inverted signal IN2B. The inverted signal IN1B is inverted by the NOR gate 174, and an output signal of the NOR gate 174, i.e. the first input signal IN1, is provided as the pull-up clock signal CKIN1P of the second clocked inverter 13. Also, the inverted signal IN1B is inverted by the NAND gate 175, and an output signal of the NAND gate 175, i.e. the first input signal IN1, is provided as the pull-down clock signal CKIN1N of the second clocked inverter 13.

Accordingly, the PMOS transistor 111 and the NMOS transistor 114 of the first clocked inverter 11 are turned ON, and the first clocked inverter 11 inverts the first input signal IN1 and then outputs an inverted signal of the first input signal IN1 to the common output terminal OUT regardless of the relative phases of the second input signal IN2. Also, the second clocked inverter 13 is clocked by the first input signal IN1, and thus inverts the second input signal IN2 and then outputs an inverted signal of the second input signal IN2 to the common output terminal OUT. Accordingly, a signal, where the phases of the first and second input signals IN1 and IN2 are interpolated, is generated in the common output terminal OUT.

When the phase of the second input signal IN2 leads the phase of the first input signal IN1, the phase indicating signal EARLY assumes the second logic state. Accordingly, the pull-up clock signal CKIN1P of the second clocked inverter 13 goes low and the pull-down clock signal CKIN1N of the second clocked inverter 13 goes high regardless of the relative phase of the inverted signal IN1B. The inverted signal IN2B is inverted by the NOR gate 154, and an output signal of the NOR gate 154, i.e. the second input signal IN2, is provided as the pull-up clock signal CKIN2P of the first clocked inverter 11. Also, the inverted signal IN2B is inverted by the NAND gate 155, and an output signal of the NAND gate 155, i.e. the second input signal IN2, is provided as the pull-down clock signal CKIN2N of the first clocked inverter 11.

Accordingly, the PMOS transistor 131 and the NMOS transistor 134 of the second clocked inverter 13 are turned ON, and the second clocked inverter 13 inverts the second input signal IN2 and then outputs an inverted signal of the second input signal IN2 to the common output terminal OUT regardless of the relative phase state of the first input signal IN1. Also, the first clocked inverter 11 is clocked by the second input signal iN2, and thus inverts the first input signal IN1 and then outputs an inverted signal of the first input signal IN1 to the common output terminal OUT. Accordingly, a signal, where the phases of the first and second input signals IN1 and IN2 are interpolated, is generated in the common output terminal OUT.

As described above, the operative configuration of the digital phase interpolator according to an embodiment of the invention may be changed so as to perform phase interpolation according to the logic state of the phase indicating signal EARLY, (i.e. a signal determined by the relative lead/lag phase relationship between the first and second input signals IN1 and IN2). Accordingly, the phase interpolation can be linearly performed regardless of (or agnostically with respect to) the relative phases input order of the first and second input signals IN1 and IN2.

Figure 2:
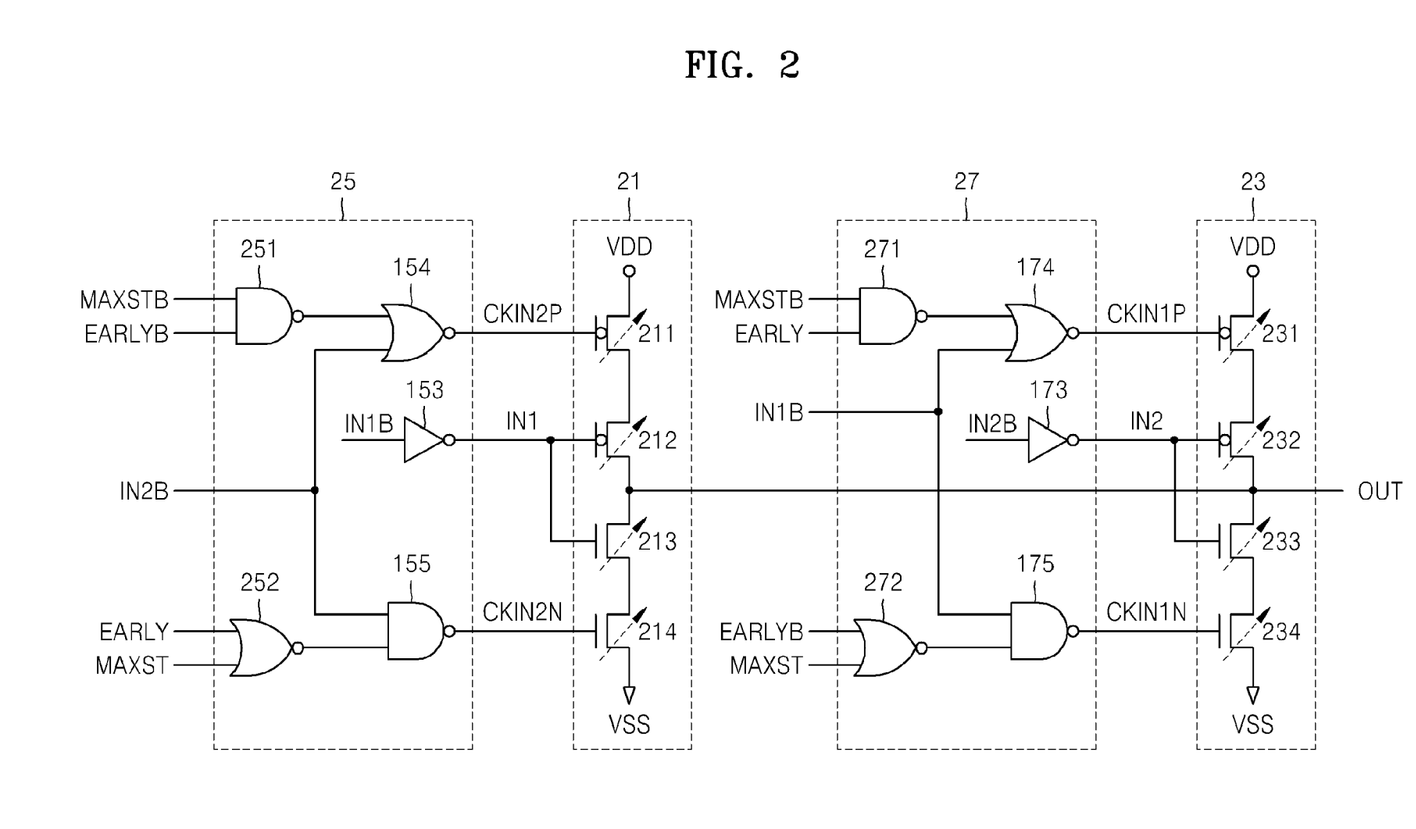
FIG. 2 is a circuit diagram illustrating a digital phase interpolator according to another embodiment of the invention, as modified for inclusion in a semi-digital DLL.
Figure 3:
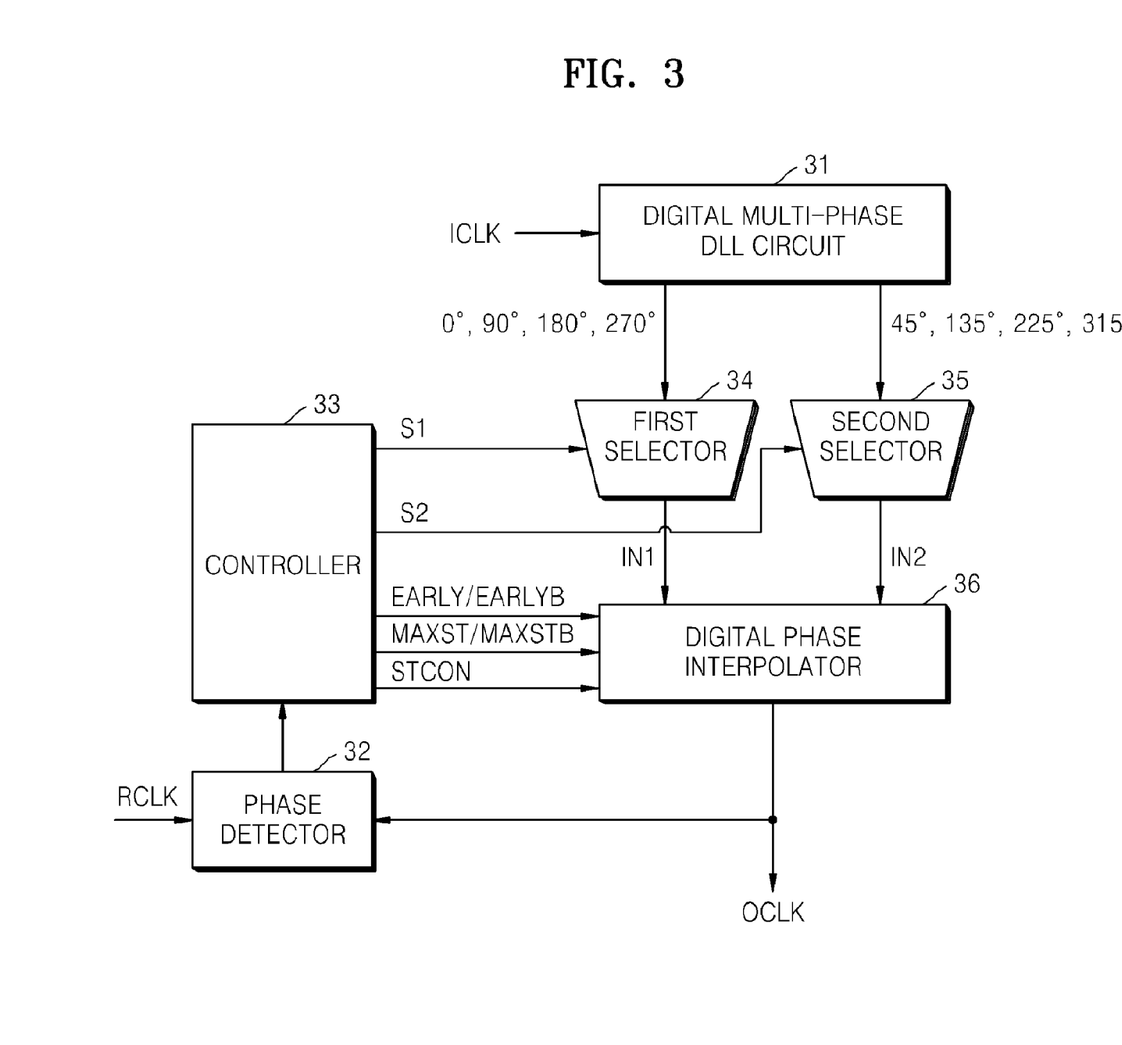
FIG. 3 is a diagram illustrating a semi-digital DLL including the digital phase interpolator illustrated in FIG. 2.

FIG. 2 is a circuit diagram illustrating a digital phase interpolator according to another embodiment of the invention which has been modified for incorporation within a semi-digital DLL. FIG. 3 is a diagram illustrating the semi-digital DLL including the digital phase interpolator of FIG. 2.

Like the digital phase interpolator of FIG. 1, the digital phase interpolator of FIG. 2 includes a first clocked inverter 21, a second clocked inverter 23, a first control circuit 25, and a second control circuit 27. Basic elements and operative aspects of the digital phase interpolator of FIG. 2 are similar to those of the digital phase interpolator of FIG. 1.

The first clocked inverter 21 is different from the first clocked inverter 11 of FIG. 1 as current driving capacity of transistors 211 through 214 is adjusted by a current strength control signal STCON, (i.e. a current driving capacity control signal, generated in a controller 33 inside the semi-digital DLL of FIG. 3). Similarly, the second clocked inverter 23 is different from the second clocked inverter 13 of FIG. 1 as current driving capacity of transistors 231 through 234 is adjusted by the current strength control signal STCON generated in the controller 33.

The first control circuit 25 is different from the first control circuit 15 of FIG. 1 as the inverter 151 is replaced by a NAND gate 251 and the inverter 152 is replaced by a NOR gate 252. Also, a maximum strength signal MAXST generated in the controller 33 is inputted to the NOR gate 252, and an inverted signal MAXSTB of the maximum strength signal MAXST generated in the controller 33 is inputted to the NAND gate 251.

The second control circuit 27 is different from the second control circuit 17 of FIG. 1 as the inverter 171 is replaced by a NAND gate 271 and the inverter 172 is replaced by a NOR gate 272. Also, the maximum strength signal MAXST is inputted to the NOR gate 272 and the inverted signal MAXSTB is inputted to the NAND gate 271.

The maximum strength signal MAXST is generated in the controller 33 in the semi-digital DLL of FIG. 3, and is activated in the first logic state when any one of current driving capacity of the first and second clocked inverters 21 and 23 reaches the maximum.

When the digital phase interpolator of FIG. 2 is employed in the semi-digital DLL of FIG. 3, a power supply voltage may be used as a supply voltage VDD of the first and second clocked inverters 21 and 23. Alternatively, a control voltage generated in the semi-digital DLL of FIG. 3 may be used as the supply voltage VDD so as to guarantee linearity according to frequency.

Referring to FIG. 3, the semi-digital DLL includes a digital multi-phase DLL circuit 31, a phase detector 32, the controller 33, a first selector 34, a second selector 35, and a digital phase interpolator 36.

The digital multi-phase DLL circuit 31 receives an input clock signal ICLK and generates first group reference clock signals (0°, 90°,180°, 270°) and second group reference clock signals (45°, 135°, 225°, 315°) having different phases. The phase detector 32 detects a phase difference between a phase reference clock signal RCLK and an output clock signal OCLK. The controller 33 generates first and second selecting signals S1 and S2, the phase indicating signal EARLY and the inverted signal EARLYB, the maximum strength signal MAXST and the inverted signal MAXSTB thereof, and the current strength control signal STCON, in response to an output signal of the phase detector 32.

The first selector 34 selects one of the first group reference clock signals (0°, 90°,180°, 270°) in response to the first selecting signal S1, and provides the selected first group reference clock signal as a first input signal IN1 of the digital phase interpolator 36. The second selector 35 selects one of the second group reference clock signals (45°, 135°, 225°, 315°) in response to the second selecting signal S2, and provides the selected second group reference clock signal as a second input signal IN2 of the digital phase interpolator 36.

In one embodiment of the invention, the digital phase interpolator 36 has the same elements as the digital phase interpolator of FIG. 2. That is, the digital phase interpolator 36 generates the output clock signal OCLK by linearly interpolating the phases of the first and second input signals IN1 and IN2 regardless of the relative phase of the input signals, first and second input signals IN1 and IN2, in response to the phase indicating signal EARLY and the inverted signal EARLYB.

Also, the current driving capacity of the first and second clocked inverters 21 and 23 of the digital phase interpolator 36 is adjusted in response to the current strength control signal STCON as described above.

The operation of semi-digital DLL of FIG. 3 and the digital phase interpolator of FIG. 2 will now be described in some additional detail.

The semi-digital DLL of FIG. 3 is implemented to use the digital phase interpolator 36 to adjust the phase of the output clock signal OCLK to the phase of the phase reference clock signal RCLK. The first and second input signals IN1 and IN2 input to the digital phase interpolator 36 are respectively selected by the first and second selectors 34 and 35 from among the reference clock signals (0°, 90°, 180°, 270°, 45°, 135°, 225°, 315°) having a uniform phase difference. Here, the controller 33 digitally controls the first and second selectors 34 and 35 by receiving information from the phase detector 32.

The first and second selectors 34 and 35 may be multiplexers, and the controller 33 may be a finite state machine (FSM).

The controller 33 controls the selection of the first and second input signals IN1 and IN2 input to the digital phase interpolator 36, and simultaneously adjusts the strength or weight of interpolating the first and second input signals IN1 and IN2 in the digital phase interpolator 36. In other words, for seamless phase change, the current strength (current driving capacity) of one of the first and second clocked inverters 21 and 23 of the digital phase interpolator 36 is linearly increased while the current strength of the other is linearly decreased.

When the current strength of any one of the first and second clocked inverter 21 and 23 reaches 0, an input signal of the corresponding clocked inverter, whose current strength is 0, is changed to a reference clock signal having a following reference phase. Then, the current strength of the clocked inverter, whose current strength is 0, is increased again, and when the current strength reaches the maximum, it is decreased again.

As described above, the phases of the first and second input signals IN1 and IN2 of the digital phase interpolator 36 continuously change according to the maximum strength signal MAXSAT and the current strength control signal STCON generated by the controller 33, and it is determined which input signal would have the preceding phase.

However, in a conventional phase digital interpolator, the first input signal IN1 should always be applied before the second input signal IN2. In other words, the phase of the first input signal IN1 should always lead the phase of the second input signal IN2. Accordingly, when the phases of the first and second input signals IN1 and IN 2 continuously change, like during the operation of a semi-digital DLL, it is not clear which input signal is first applied and the conventional digital phase interpolator is difficult to use.

Accordingly, the semi-digital DLL of FIG. 3 uses the digital phase interpolator of FIG. 2, which operates regardless of the relative input order of the first and second input signals IN1 and IN2.

The phase indicating signal EARLY indicates the phase relationship between the first and second input signals IN1 and IN2. When the phase of the first input signal IN1 leads the phase of the second input signal IN2, the phase indicating signal EARLY is in the first logic state. Thus, the maximum strength signal MAXST is high (under the foregoing working assumptions) when the current driving capacity of any one of the first and second clocked inverters 21 and 23 is the maximum.

IN contrast, when the maximum strength signal MAXST is low, the digital phase interpolator 36 (FIG. 2) performs phase interpolation as the configuration of the digital phase interpolator 36 (FIG. 2) changes according to the logic state of the phase indicating signal EARLY, (i.e. according to the relative input order of the first and second input signals IN1 and IN2) like the digital phase interpolator of FIG. 1. Accordingly, the digital phase interpolator 36 (FIG. 2) can linearly perform the phase interpolation regardless of the relative phase states of the first and second input signals IN1 and IN2.

However, when the maximum strength signal MAXST is high, an input signal of one of the first and second clocked inverters 21 and 23 whose current strength is 0 is changed to a reference clock signal having a following reference phase, and the logic state of the phase indicating signal EARLY is changed. As a result, configuration conditions of the first and second clocked inverters 21 and 23 change.

At this time, the seamless characteristic instantly breaks, and thus in order to protect the seamless characteristic, the NMOS transistor 214 and PMOS transistor 211 of the first clocked inverter 21, and the NMOS transistor 234 and the PMOS transistor 231 of the second clocked inverter 23 are unconditionally turned ON when the maximum strength signal MAXST is high, regardless of the logic states of phase indicating signal EARLY.

Figure 4:
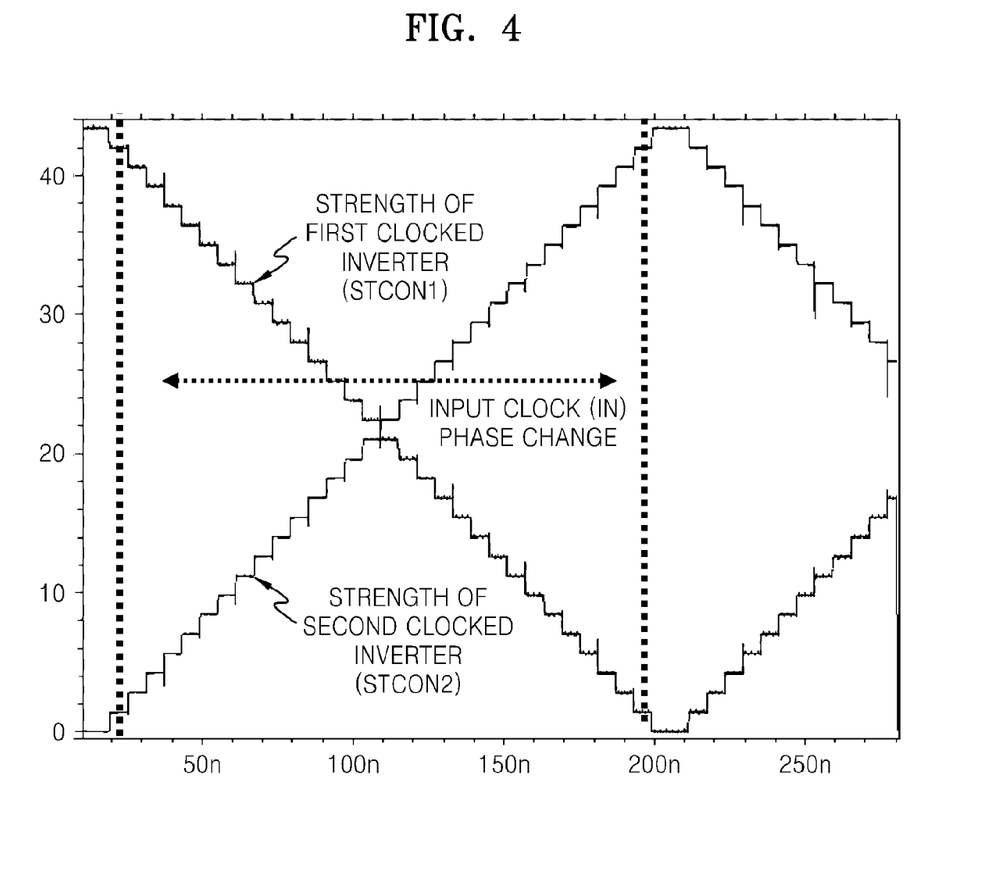
FIG. 4 is a diagram illustrating a current strength control signal for adjusting the strength of the digital phase interpolator illustrated in FIG. 3.
Figure 5:
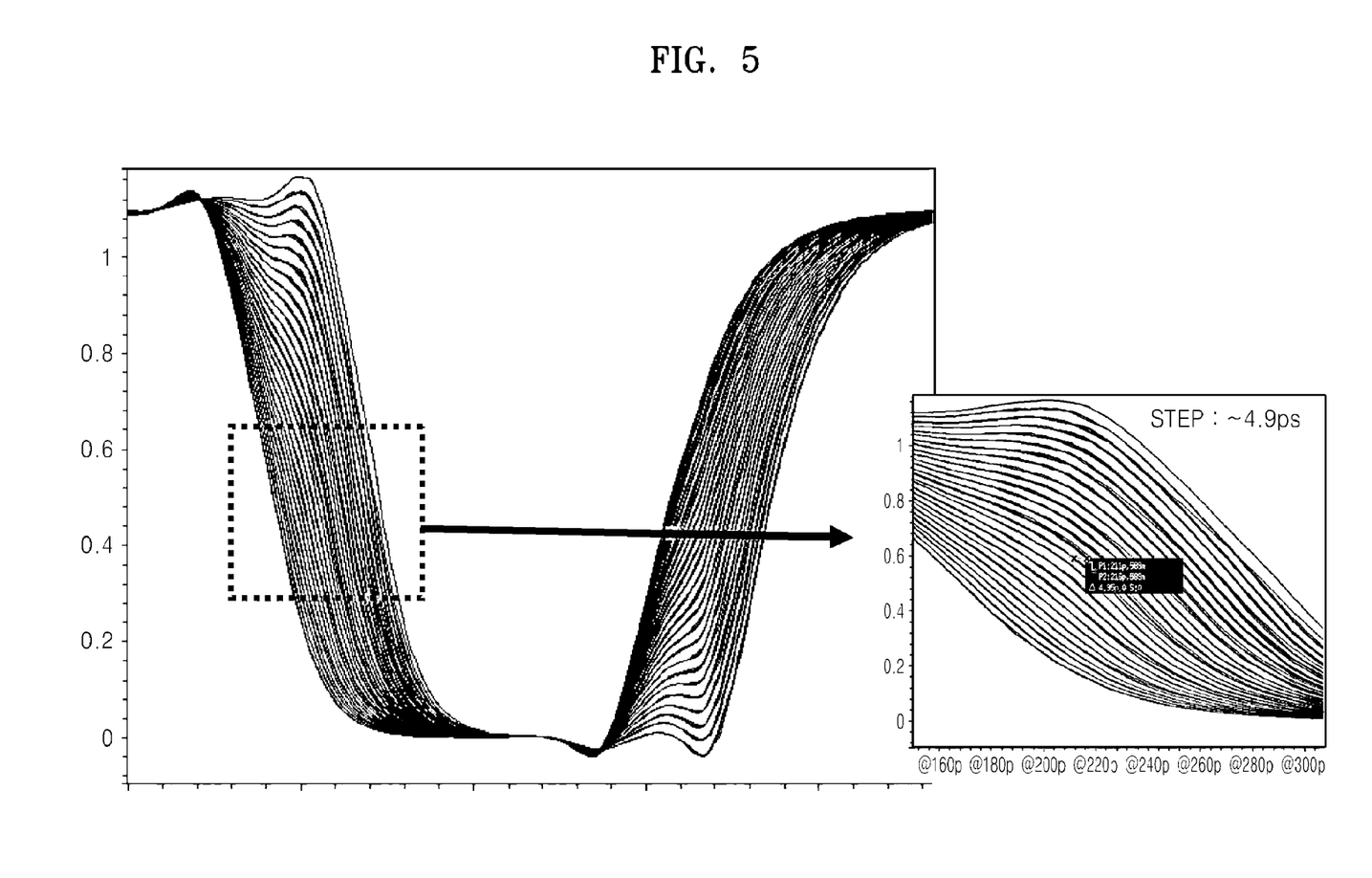
FIG. 5 is a graph illustrating simulation results for an output signal provided by the digital phase interpolator illustrated in FIG. 3.

FIG. 4 is a diagram illustrating current strength control signals STCON1 and STCON2 generated by the controller 33 for adjusting the strength of the digital phase interpolator 36, (i.e. the strengths of the first and second clocked inverters 21 and 23). FIG. 5 is a graph illustrating simulation results for the output signal OCLK of the digital phase interpolator 36. Referring to FIG. 5, it can be seen that the phase of the output signal OCLK is linearly seamless both in a rising edge and a falling edge.

As described above, the configuration of the digital phase interpolator according to an embodiment of the present invention changes according to the logic state of the phase indicating signal, (i.e. the input order of the first and second input signals), in order for the digital phase interpolator to perform the phase interpolation. Accordingly, the digital phase interpolator can linearly perform the phase interpolation regardless of the input order of two input signals.

While the present invention has been particularly shown and described with reference to exemplary embodiments thereof, it will be understood by those of ordinary skill in the art that various changes in form and details may be made therein without departing from the scope of the present invention as defined by the following claims.

What is claimed is:

1. A phase interpolator comprising:
   a first clocked inverter, controlled by a phase indicating signal and providing a first output signal to a common output terminal by inverting a first input signal; and
   a second clocked inverter, controlled by the phase indicating signal and providing a second output signal to the common output terminal by inverting a second input signal,
   wherein the second clocked inverter is clocked by the first input signal when the phase indicating signal is in a first logic state, and the first clocked inverter is clocked by the second input signal when the phase indicating signal is in a second logic state.

2. The phase interpolator of claim 1, wherein the phase indicating signal indicates a relative lead/lag phase difference between the first and second input signals.

3. The phase interpolator of claim 2, wherein when the phase of the first input signal leads the phase of the second input signal, the phase indicating signal is in the first logic state, and when the phase of the second input signal leads the phase of the first input signal, the phase indicating signal is in the second logic state.

4. The phase interpolator of claim 1, further comprising:
   a first control circuit providing the second input signal as a clock signal of the first clocked inverter when the phase indicating signal is in the second logic state; and
   a second control circuit providing the first input signal as a clock signal of the second clocked inverter when the phase indicating signal is in the first logic state.

5. The phase interpolator of claim 4, wherein the first control circuit comprises:
   a first inverter receiving an inverted signal of the phase indicating signal;
   a NOR gate receiving an output signal of the first inverter and an inverted signal of the second input signal and having an output signal provided as a pull-up clock signal to the first clocked inverter;
   a second inverter receiving the phase indicating signal;
   a NAND gate receiving an output signal of the second inverter and the inverted signal of the second input signal and having an output signal provided as a pull-down clock signal to the first clocked inverter; and a third inverter receiving an inverted signal of the first input signal and having an output signal provided as the first input signal.

6. The phase interpolator of claim 5, wherein the first clocked inverter comprises:
   a first PMOS transistor having a drain, a source receiving a supply voltage, and a gate receiving the pull-up clock signal of the first clocked inverter;
   a second PMOS transistor having a source connected to the drain of the first PMOS transistor, a gate receiving the first input signal, and a drain connected to the common output terminal;
   a first NMOS transistor having a source, a drain connected to the common output terminal, and a gate receiving the first input signal; and
   a second NMOS transistor having a drain connected to the source of the first NMOS transistor, a gate receiving the pull-down clock signal of the first clocked inverter, and a source connected to ground.

7. The phase interpolator of claim 4, wherein the second control circuit comprises:
   a first inverter receiving the phase indicating signal;
   a NOR gate receiving an output signal of the first inverter and an inverted signal of the first input signal and having an output signal provided as a pull-up clock signal to the second clocked inverter;
   a second inverter receiving an inverted signal of the phase indicating signal;
   a NAND gate receiving an output signal of the second inverter and the inverted signal of the first input signal and having an output signal provided as a pull-down clock signal to the second clocked inverter; and
   a third inverter receiving an inverted signal of the second input signal and having an output signal provided as the second input signal.

8. The phase interpolator of claim 7, wherein the second clocked inverter comprises:
   a first PMOS transistor having a drain, a source receiving a supply voltage, and a gate receiving the pull-up clock signal of the second clocked inverter;
   a second PMOS transistor having a source connected to the drain of the first PMOS transistor, a gate receiving the second input signal, and a drain connected to the common output terminal;
   a first NMOS transistor having a source, a drain connected to the common output terminal, and a gate receiving the second input signal; and
   a second NMOS transistor having a drain connected to the source of the first NMOS transistor, a gate receiving the pull-down clock signal of the second clocked inverter, and a source connected to ground.

9. A circuit of a semi-digital delay locked loop (DLL), the circuit comprising:
   a digital multi-phase DLL circuit generating first group reference clock signals and second group reference clock signals having different phases in relation to an input clock signal;
   a phase detector detecting a phase difference between a phase reference clock signal and an output clock signal;
   a controller generating first and second selecting signals, and a phase indicating signal in response to an output signal of the phase detector;
   a first selector outputting one of the first group reference clock signals in response to the first selecting signal;
   a second selector outputting one of the second group reference signals in response to the second selecting signal; and
   a digital phase interpolator generating the output clock signal by linearly interpolating phases of the first and second input signals regardless of the relative lead/lag phase states of the first and second input signals, wherein the phase of the first input signal is provided from the first selector and the phase of the second input signal provided from the second selector in response to the phase indicating signal, and wherein the digital phase interpolator comprises:
   a first clocked inverter controlled by the phase indicating signal and providing a first output signal to a common output terminal by inverting the first input signal; and
   a second clocked inverter controlled by the phase indicating signal and providing a second output signal to the common output terminal by inverting a second input signal, wherein the second clocked inverter is clocked by the first input signal when the phase indicating signal is in a first logic state, and the first clocked inverter is clocked by the second input signal when the phase indicating signal is in a second logic state.

10. The circuit of claim 9, wherein the phase indicating signal indicates a relative lead/lag phase relationship between the first and second input signals.

11. The circuit of claim 10, wherein when the phase of the first input signal leads the phase of the second input signal, the phase indicating signal is in the first logic state, and when the phase of the second input signal leads the phase of the first input signal, the phase indicating signal is in the second logic state.

12. The circuit of claim 9, wherein the digital phase interpolator further comprises:
   a first control circuit providing the second input signal as a clock signal to the first clocked inverter when the phase indicating signal is in the second logic state; and
   a second control circuit providing the first input signal as a clock signal to the second clocked inverter when the phase indicating signal is in the first logic state.

13. The circuit of claim 12, wherein the first control circuit comprises:
   a first NAND gate receiving an inverted phase indicating signal and an inverted maximum strength signal;
   a first NOR gate receiving an output signal from the first NAND gate and an inverted second input signal and having an output signal provided as a pull-up clock signal to the first clocked inverter;
   a second NOR gate receiving the phase indicating signal and a maximum strength signal;
   a second NAND gate receiving an output signal from the second NOR gate and the inverted second input signal, and having an output signal provided as a pull-down clock signal to the first clocked inverter; and
   an inverter receiving an inverted first input signal and having an output signal provided as the first input signal.

14. The circuit of claim 13, wherein the maximum strength signal is generated by the controller and is activated in the first logic state when any one of the current driving capacities of the first and second clocked inverters reaches a respectively defined maximum.

15. The circuit of claim 13, wherein the first clocked inverter comprises:
   a first PMOS transistor having a drain, a source receiving a supply voltage, and a gate receiving the pull-up clock signal of the first clocked inverter;

a second PMOS transistor having a source is connected to the drain of the first PMOS transistor, a gate receiving the first input signal, and a drain connected to the common output terminal;
an NMOS transistor having a source, a drain connected to the common output terminal, and a gate receiving the first input signal; and
a second NMOS transistor having a drain connected to the source of the first NMOS transistor, a gate receiving the pull-down clock signal of the first clocked inverter, and a source connected to ground.

16. The circuit of claim 12, wherein the second control circuit comprises:
   a first NAND gate receiving the phase indicating signal and an inverted maximum strength signal;
   a first NOR gate receiving an output signal from the first NAND gate and an inverted first input signal, and having an output signal provided as a pull-up clock signal to the second clocked inverter;
   a second NOR gate receiving an inverted phase indicating signal and a maximum strength signal;
   a second NAND gate receiving an output signal from the second NOR gate and the inverted first input signal, and having an output signal provided as a pull-down clock signal to the second clocked inverter; and
   an inverter receiving an second input signal and having an output signal provided as the second input signal.

17. The circuit of claim 16, wherein the maximum strength signal is generated by the controller and is activated in the first logic state when any one of the current driving capacities of the first and second clocked inverters reaches a respectively defined maximum.

18. The circuit of claim 16, wherein the second clocked inverter comprises:
   a first PMOS transistor having a drain, a source receiving a supply voltage, and a gate receiving the pull-up clock signal of the second clocked inverter;
   a second PMOS transistor having a source connected to the drain of the first PMOS transistor, a gate receiving the second input signal, and a drain connected to the common output terminal;
   a first NMOS transistor having a source, a drain connected to the common output terminal, and a gate receiving the second input signal; and
   a second NMOS transistor having a drain connected to the source of the first NMOS transistor, a gate receiving the pull-down clock signal of the second clocked inverter, and a source connected to ground.

19. The circuit of claim 9, wherein the controller further generates a current strength control signal, and the respective current driving capacities of the first and second clocked inverters are adjusted by the current strength control signal.

* * * * *